United States Patent
Rathi et al.

(10) Patent No.: US 9,697,908 B1
(45) Date of Patent: Jul. 4, 2017

(54) NON-DISCHARGING READ-ONLY MEMORY CELLS

(71) Applicant: ARM Limited, Cambridge (GB)

(72) Inventors: Kapil Rathi, Bangalore (IN); Abhishek Kumar Shrivastava, Bangalore (IN); Vikash, Bangalore (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/179,686

(22) Filed: Jun. 10, 2016

(51) Int. Cl.
*G11C 17/00* (2006.01)
*G11C 17/08* (2006.01)
*G11C 13/00* (2006.01)
*G11C 17/12* (2006.01)
*G11C 17/10* (2006.01)

(52) U.S. Cl.
CPC .......... *G11C 17/08* (2013.01); *G11C 13/0007* (2013.01); *G11C 17/10* (2013.01); *G11C 17/12* (2013.01)

(58) Field of Classification Search
CPC ......... G11C 17/08; G11C 17/14; G11C 17/12; G11C 17/126; G11C 17/10; G11C 13/0007
USPC ....................... 365/104, 63, 72, 94
See application file for complete search history.

(56) References Cited

U.S. PATENT DOCUMENTS

| | | |
|---|---|---|
| 5,917,224 A | 6/1999 | Zangara |
| 6,002,607 A | 12/1999 | Dvir |
| 6,636,434 B2 | 10/2003 | Poullet |
| 6,879,509 B2 | 4/2005 | Evans et al. |
| 7,243,206 B2 | 7/2007 | Kimelman et al. |
| 7,936,578 B2 | 5/2011 | Nevers et al. |
| 8,106,463 B2 | 1/2012 | Moharir et al. |
| 8,422,262 B2 * | 4/2013 | Nevers ............... G06F 17/5068 365/104 |
| 8,605,480 B2 | 12/2013 | Jain et al. |
| 9,202,588 B1 | 12/2015 | Kohli et al. |
| 9,268,942 B2 | 2/2016 | Mersh |
| 2010/0177544 A1 * | 7/2010 | Nevers ............... G06F 17/5068 365/51 |
| 2011/0273919 A1 | 11/2011 | Buer et al. |
| 2014/0003121 A1 | 1/2014 | Dasani |

OTHER PUBLICATIONS

Read-only memory; Wikipedia; May 31, 2016(accessed Jun. 9, 2016). https://en.wikipedia.org/wiki/Read-only_memory.

* cited by examiner

*Primary Examiner* — Tan T. Nguyen
(74) *Attorney, Agent, or Firm* — Pramudji Law Group PLLC; Ari Pramudji

(57) ABSTRACT

Various implementations described herein may refer to and may be directed to non-discharging read-only memory cells. For instance, in one implementation, an integrated circuit may include a read-only memory (ROM) array including a plurality of ROM cells arranged into a column, where the column is disposed proximate to a bit line and to a reference voltage line. The plurality of ROM cells arranged into the column may include a plurality of non-discharging ROM cells positioned adjacently to one another, where each non-discharging ROM cell has a source terminal, a drain terminal, or both coupled to at least one adjacent non-discharging ROM cell. In addition, the plurality of non-discharging ROM cells may be coupled to the bit line using two or fewer connections.

11 Claims, 6 Drawing Sheets

NON-DISCHARGING READ-ONLY MEMORY CELLS

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Integrated circuits (IC) may be formed from arrangements of one or more input/output devices, standard devices, memory devices, and/or the like. In one scenario, memory devices may include memory arrays arranged into memory cells and the associated circuitry to read data from the memory cells.

In particular, the memory devices may be non-volatile memory devices, such as read-only memory (ROM) devices. Such ROM devices may include one or more ROM arrays having memory cells that are configured to store a data bit that is representative of a logical "1" or "0," even in the absence of power. High density ROM devices have also been used, where such devices may include ROM arrays composed of columns of memory cells.

BRIEF DESCRIPTION OF THE DRAWINGS

Implementations of various techniques will hereafter be described herein with reference to the accompanying drawings. It should be understood, however that the accompanying drawings illustrate only various implementations described herein and are not meant to limit the scope of various technologies described herein.

DETAILED DESCRIPTION

Various implementations described herein may refer to and may be directed to non-discharging read-only memory cells. For instance, in one implementation, an integrated circuit may include a read-only memory (ROM) array including a plurality of ROM cells arranged into a column, where the column is disposed proximate to a bit line and to a reference voltage line. The plurality of ROM cells arranged into the column may include a plurality of non-discharging ROM cells positioned adjacently to one another, where each non-discharging ROM cell has a source terminal, a drain terminal, or both coupled to at least one adjacent non-discharging ROM cell. In addition, the plurality of non-discharging ROM cells may be coupled to the bit line using two or fewer connections.

Various implementations of non-discharging read-only memory cells will now be described in more detail with reference to FIGS. 1-6.

As noted above, integrated circuits (IC) may be formed from arrangements of one or more input/output devices, standard devices, memory devices, and/or other devices. Input/output devices may be used to provide signals between the connection pins of the IC and the standard devices and memory devices arranged within the IC. Standard devices may be circuit implementations of flip-flops, arithmetic logic units, multiplexers, retention flops, balloon flops, latches, logic gates, and/or the like. Memory devices may include memory arrays arranged into memory cells and the associated circuitry to at least read data from the memory cells. In particular, the memory array may include a plurality of individual memory cells, where each memory cell may be used to store a data bit that is representative of a logical "1" or "0".

The memory devices may include non-volatile memory devices, such as read-only memory (ROM) devices. A ROM device may include one or more ROM arrays composed of ROM cells, where the ROM cells are configured to store data bit values permanently, even in the absence of power (e.g., after a power down).

Figure 1:
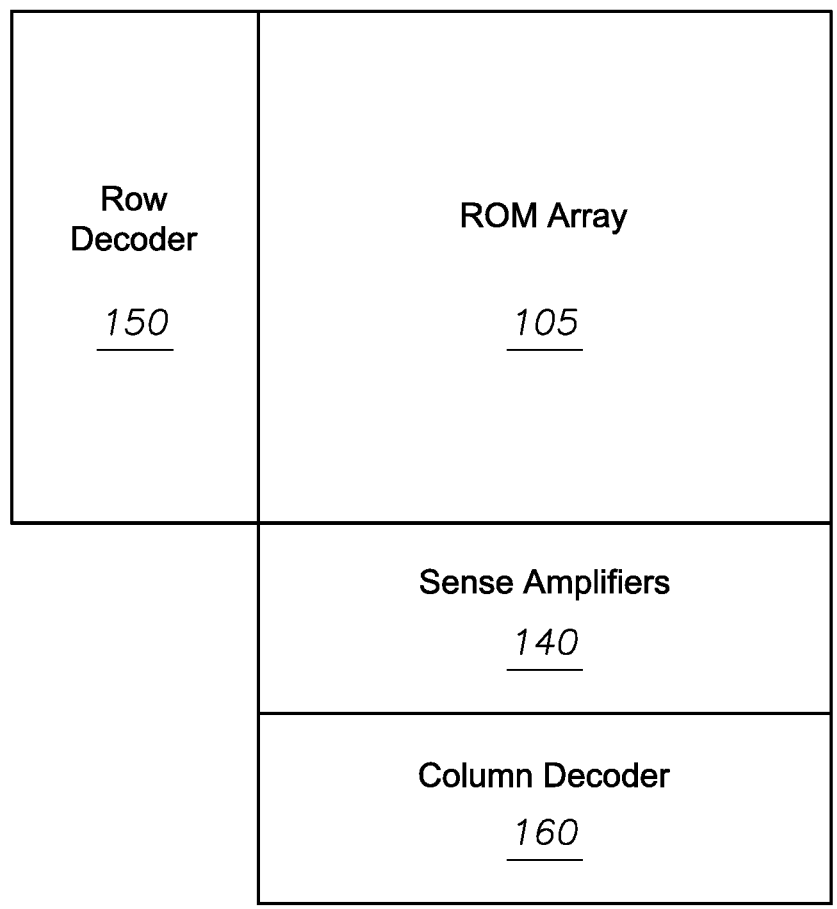
FIG. 1 illustrates a block diagram of an embedded memory device in connection with various implementations described herein.

For example, FIG. 1 illustrates a block diagram of an embedded memory device 100 in connection with various implementations described herein. The memory device 100 may include a memory array 105, row decoder 150, one or more sense amplifiers 140, and column decoder 160.

In particular, the memory array 105 may be a ROM array, as described above. The ROM array 105 may include a plurality of individual ROM cells, which may be organized in rows and columns. The array 105 may have M rows and N columns, and, therefore, may have M×N individual ROM cells. Each memory ROM cell may be used to store a data bit that is representative of a logical "1" or "0". Each ROM cell may be any switching device known to those skilled in the art, such as a single transistor configured to store a data bit value. For example, each ROM cell may be a metal oxide semiconductor field effect transistor (MOSFET), such as an NMOS or PMOS transistor, or any other type of transistor known in the art.

The ROM array 105 may also include a plurality of word-lines, a plurality of bit lines, and one or more reference voltage lines, as is known in the art. The plurality of word-lines and bit lines may be used to perform a read operation on the ROM array 105, as is further described below.

Each ROM cell of the array 105 may be positioned proximate to at least one bit line and at least one reference voltage line. In one implementation, in a high density ROM array, the ROM cells may be arranged into a plurality of columns, where adjacent ROM cells in the same column share a source or drain terminal connection to an adjacent bit line or adjacent reference voltage line. One implementation for a ROM array 105 is further described with respect to FIG. 2.

Figure 2:
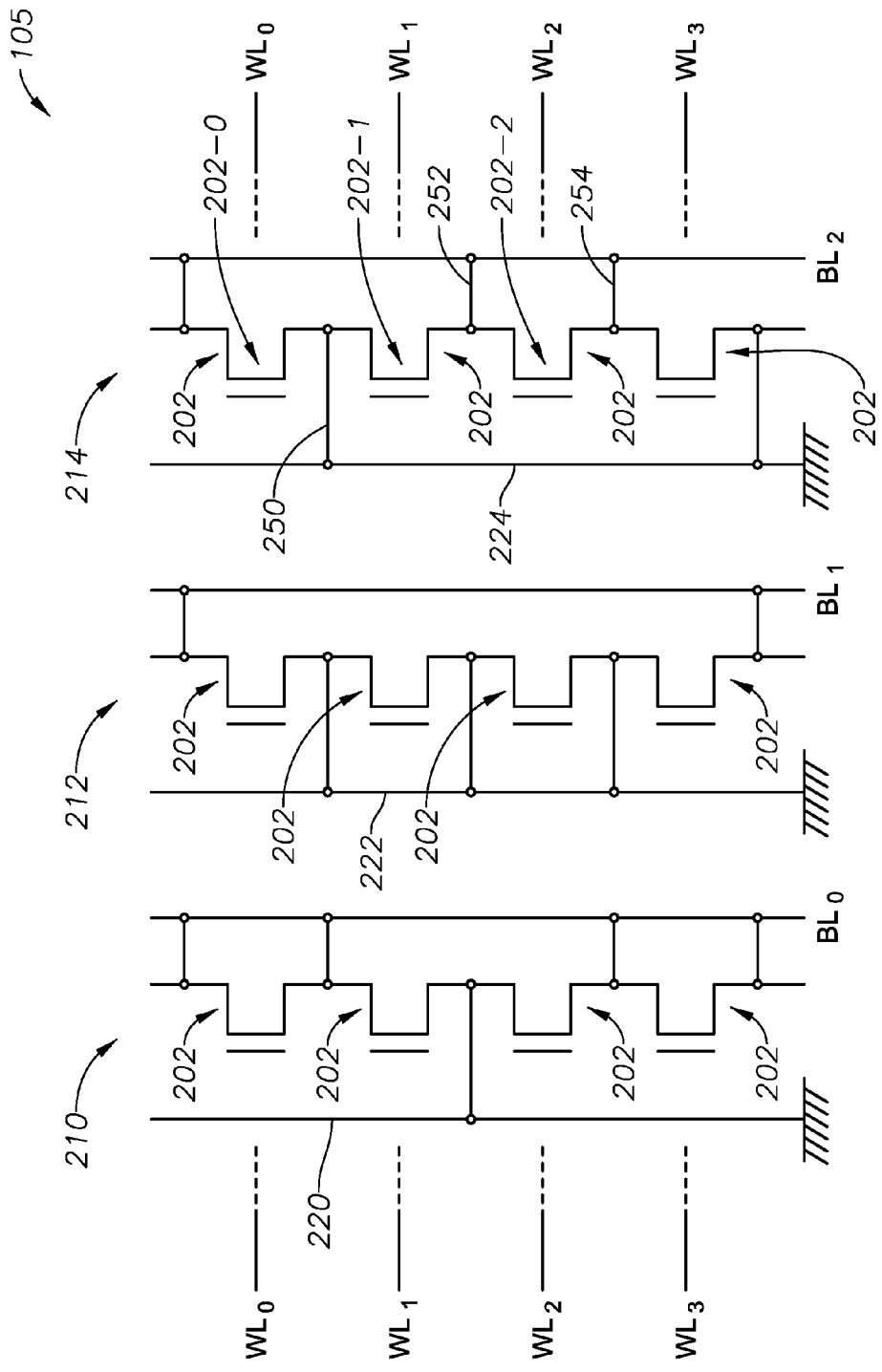
FIG. 2 illustrates a schematic diagram of a read-only memory (ROM) array in connection with various implementations described herein.

FIG. 2 illustrates a schematic diagram of a ROM array 105 in connection with various implementations described herein. The ROM array 105 may be composed of ROM cells 202 arranged into a plurality of columns, of which only columns 210, 212, and 214 are shown. It is understood by those skilled in the art that greater than or fewer than three such columns may be used in the ROM array 105. Each ROM cell 202 may comprise an NMOS transistor, though, as noted above, other transistors known in the art, such as a PMOS transistor, may be used.

The ROM array 105 shown in FIG. 2 may also include a plurality of word lines (WL) $WL_0$, $WL_1$, $WL_2$, and $WL_3$, a plurality of column bit lines (BL) $BL_0$, $BL_1$, and $BL_2$, and a plurality of reference voltage lines 220, 222, and 224. As is further described below, each row of ROM cells 202 may be connected to at least one of the plurality of word-lines, where each word-line may activate a particular row of the ROM cells 202. As is also described below, each column of ROM cells 202 may be associated with at least one of the plurality of column bit-lines.

As shown, each column of ROM cells 202 may have an associated reference voltage line and bit line. For example, the column 210 of ROM cells may be disposed between a reference voltage line 220 and bit line $BL_0$, the column 212 of ROM cells may be disposed between a reference voltage line 222 and bit line $BL_1$, and the column 214 of ROM cells may be disposed between a reference voltage line 224 and bit line $BL_2$. Though FIG. 2 illustrates the reference voltage lines 220, 222 and 224 and the bit lines $BL_0$, $BL_1$, and $BL_2$ as being arranged such that the bit line of one column is adjacent to the virtual ground line of the next column, other configurations may be used instead. For example, in another implementation, a bit line associated with one column may be disposed next to a bit line associated with another column, a reference voltage line associated with one column may be disposed next to a reference voltage line associated with another column, and/or the like. In yet another implementation, multiple columns of cells 202 may share a bit line and/or reference voltage line.

In addition, as shown in FIG. 2, adjacent ROM cells 202 in each column may share a source terminal connection or a drain terminal connection with one another. Either the source or drain terminal connection for a cell 202 may be hereinafter referred to as a drain connection. As shown in FIG. 2, a shared drain connection may couple two ROM cells 202 to a reference voltage line or bit line associated with the column for those cells. For example, ROM cell 202-0 may share a drain connection with ROM cell 202-1, and this shared drain connection may be used to couple to the reference voltage line 224. In addition, the ROM cell 202-1 may share a drain connection with ROM cell 202-2, and this shared drain connection may be used to couple to the bit line $BL_2$. Such shared drain connections may allow for a high density of ROM cells 202 in the array 105; as such, the array 105 may be referred to as a high density ROM array.

The word lines $WL_0$, $WL_1$, $WL_2$, and $WL_3$ extend fully across the ROM array 105, though are not illustrated as such in FIG. 2 for purposes of clarity. As is known in the art, the gate terminal of each ROM cell 202 may be coupled to a word line associated with the row of that cell 202. For example, the gate terminal of cell 202-0 may be coupled to word line $WL_0$, the gate terminal of cell 202-1 may be coupled to word line $WL_1$, and the gate terminal of cell 202-2 may be coupled to word line $WL_2$.

A memory cell 202 may be encoded with a data bit that is representative of a logical "1" or "0" based on the presence or absence of connections between the source and drain terminals of the cell 202, the reference voltage line associated with the column of the cell 202, and the bit line associated with the column of the cell 202. The connections between the terminals of a cell 202 and an associated reference voltage line or bit line may be made using any connection means known to those skilled in the art, such as vias and/or the like. Vias may also be used for the shared drain connections described above.

When performing one or more read operations on the memory cells 202 of the array 105, one or more of the bit lines $BL_0$, $BL_1$, and $BL_2$ may initially be pre-charged. The bit lines may be pre-charged to any voltage level known to those in the art, such as a power supply voltage level (i.e., $V_{DD}$). The one or more reference voltage lines of the array 105 may also be set to a lower voltage level than the pre-charged bit lines. For example, the reference voltage lines may be set to a ground voltage level.

To encode a data bit that is representative of a logical "0" to a particular cell 202, one of the drain connections of the cell 202 may be coupled to the associated bit line and the remaining drain connection of the cell 202 may be coupled to the reference voltage line. For example, ROM cell 202-1 may have one drain connection coupled to the reference voltage line 224 using via 250, and the cell 202-1 may have the other drain connection coupled to the bit line $BL_2$ using via 252. Thus, during a read operation, when bit line $BL_2$ is pre-charged and word line $WL_1$ is enabled, the ROM cell 202-1 may discharge the bit line $BL_2$ onto the reference voltage line 224. As such, ROM cell 202-1 may be referred to as a discharging ROM cell. Thus, as is further described below, in response to the read operation on the ROM cell 202-1, the discharged bit line $BL_2$ may output a value representative of logical "0".

To encode a data bit that is representative of a logical "1" to a particular cell 202, both drain connections of the cell 202 may be coupled to the associated bit line, or both drain connections of the cell 202 may be coupled to the associated reference voltage line. For example, ROM cell 202-2 may have both drain connections coupled to the bit line $BL_2$ using vias 252 and 254. Thus, during a read operation, when bit line $BL_2$ is pre-charged and word line $WL_2$ is enabled, no significant discharge of the bit line $BL_2$ may occur. As such, ROM cell 202-2 may be referred to as a non-discharging ROM cell. As is further described below, the charged bit line $BL_2$ may output a value representative of logical "1", thus producing the data bit value of ROM cell 202-2. It will be understood by those in the art that the encoding of "1" and "0" described above is merely a convention choice and could be trivially inverted.

Thus, the ROM cells of a ROM array may be preprogrammed (i.e., encoded) with predetermined data bit values, which may be output using the plurality of bit lines of the ROM array. Further, the data bit values may be encoded into the ROM cells using one or more vias. In one implementation, the data bit values to be stored in ROM cells of a ROM array may be received by a computing system (as further described below), and the computing system may generate a layout of the ROM array that includes one or more vias in the array for encoding the data bit values into the cells.

Returning to FIG. 1, during a read operation of the ROM array 105, a row decoder 150 may receive address information (e.g., an address word) and then enable a row in the array 105 corresponding to the address word. Enabling a row may, in turn, activate the cells of that row via their respective gate terminals. A column decoder 160 may also receive address information, and enable columns in the array 105 corresponding to the address. In particular, one or more of the bit lines of the array corresponding to the columns may be pre-charged. One or more sense amplifiers 140 may be connected to the plurality of bit-lines of the array 105, which may detect a corresponding high or low voltage on the bit lines, and the corresponding data bit values may then be transmitted from the array 105 as outputs. A particular data word may be output by the ROM array 105 by enabling the appropriate row and columns of the array 105.

Figure 3:
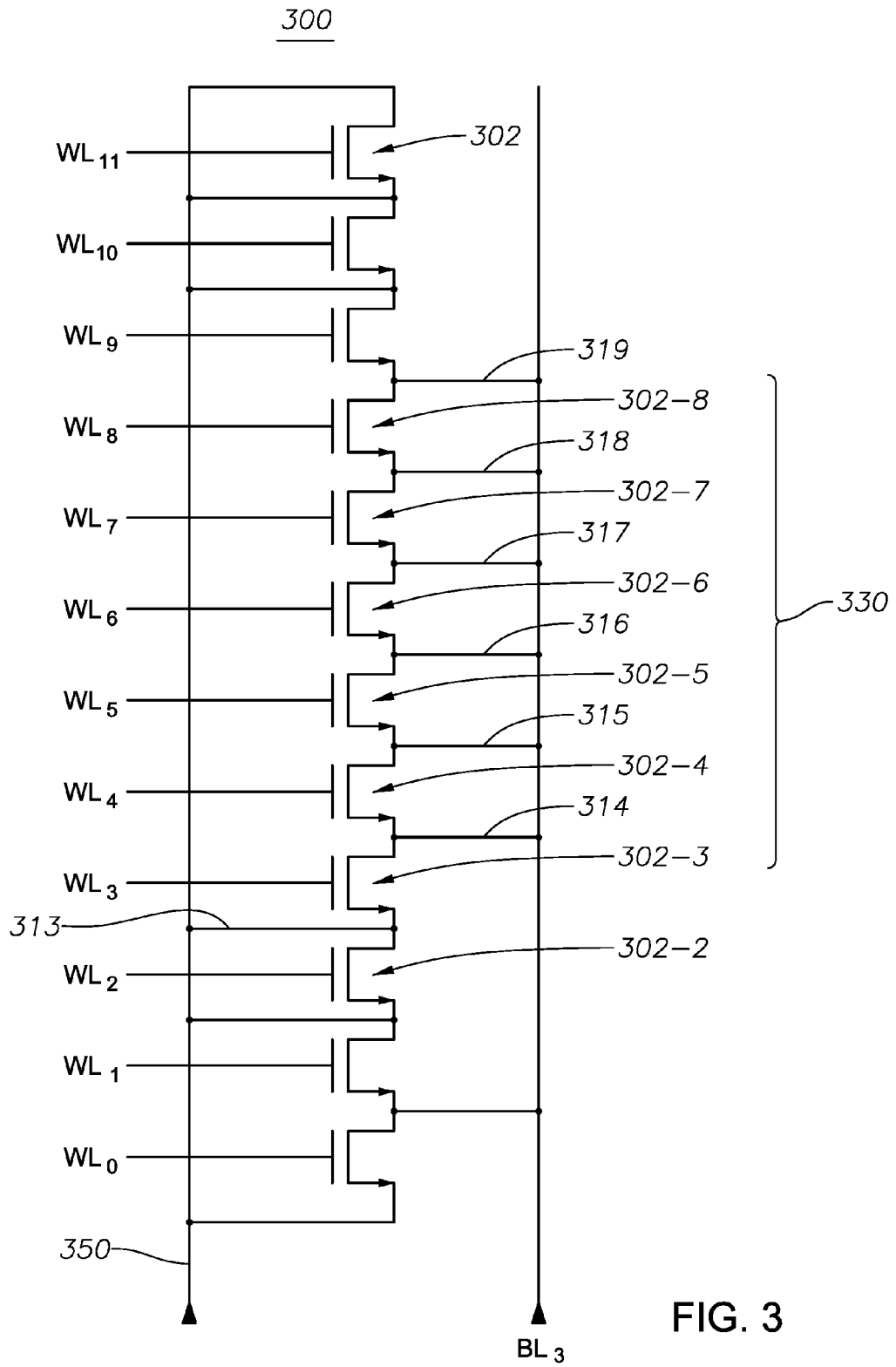
FIG. 3 illustrates a schematic diagram of a column of adjacent ROM cells in connection with various implementations described herein.

In some implementations, the process of encoding data bit values to ROM cells by coupling vias between the ROM cells and an associated bit line may lead to an increase in capacitance on the bit line. For example, FIG. 3 illustrates a schematic diagram of a column 300 of adjacent ROM cells 302 in connection with various implementations described herein. The column 300 may be included in a similar ROM array as those discussed above, such as ROM array 105. One or more other columns of ROM cells 302 may also be included in the same ROM array, though are not pictured in FIG. 3. The ROM cells 302 are adjacent within the column 300, in that each ROM cell in the column 300 shares at least one source or drain terminal connection (i.e., a drain connection) to an adjacent ROM cell, where such a drain connection may be used to couple to a bit line or reference voltage line, as further described below. As shown, the ROM cells 302 may include twelve ROM cells 302, though those in the art understand that greater than or fewer than twelve ROM cells 302 may be used.

The ROM array that includes the column 300 may also include a plurality of word lines (WL) $WL_0$ to $WL_{11}$, a column bit line $BL_3$, and a reference voltage line 350. Each row of ROM cells 302 may be connected to at least one of the plurality of word lines, where each word line may activate a particular row of the ROM cells 302. The column of ROM cells 302 may be disposed proximate to column bit line $BL_3$ and the reference voltage line 350.

As shown, each ROM cell 302 may comprise an NMOS transistor, though, as noted above, other transistors known in the art, such as a PMOS transistor, may be used. As also shown, adjacent ROM cells 302 in the column 300 may share a source terminal connection or a drain terminal connection (i.e., a drain connection) with one another. A shared drain connection may couple two ROM cells 302 to the reference voltage line 350 or to the bit line $BL_3$. For example, ROM cell 302-2 may share a drain connection with ROM cell 302-3, and this shared drain connection may be used to couple to the reference voltage line 350 using via 313.

When performing one or more read operations on the memory cells 302, the bit lines $BL_3$ may initially be pre-charged. In particular, the bit line $BL_3$ may be pre-charged to any voltage level known to those in the art, such as a power supply voltage level (i.e., $V_{DD}$). The reference voltage line 350 may also be set to a lower voltage level than the pre-charged bit line $BL_3$. For example, the reference voltage line 350 may be set to a ground voltage.

Similar to above, to encode a data bit that is representative of a logical "0" to cell 302, one of the drain connections of the cell 302 may be coupled to the bit line $BL_3$ and the remaining drain connection of the cell 302 may be coupled to the reference voltage line 350. For example, ROM cell 302-3 may have one drain connection coupled to the reference voltage line 350 using via 313, and the cell 302-3 may have the other drain connection coupled to the bit line $BL_3$ using via 314. Thus, during a read operation, when bit line $BL_3$ is pre-charged and word line $WL_3$ is enabled, the ROM cell 302-3 may discharge the bit line $BL_3$ onto the reference voltage line 350. As such, ROM cell 302-3 may be referred to as a discharging ROM cell. Thus, in response to the read operation on the ROM cell 302-3, the discharged bit line $BL_3$ may output a value representative of logical "0".

Further, and also similar to above, to encode a data bit that is representative of a logical "1" to a particular cell 302, both drain connections of the cell 302 may be coupled to the bit line $BL_3$, or both drain connections of the cell 302 may be coupled to the reference voltage line 350. For example, ROM cell 302-8 may have both drain connections coupled to the bit line $BL_3$ using vias 319 and 318. Thus, during a read operation, when bit line $BL_3$ is pre-charged and word line $WL_8$ is enabled, no significant discharge of the bit line $BL_3$ may occur. As such, ROM cell 302-8 may be referred to as a non-discharging ROM cell. Thus, in response to the read operation on the ROM cell 302-8, the charged bit line $BL_3$ may output a value representative of logical "1".

As is also shown in FIG. 3, a subset of the column 300 of adjacent ROM cells 302 may include a series 330 of non-discharging ROM cells positioned adjacently to one another. In particular, this series 330 of non-discharging ROM cells may include ROM cells 302-4, 302-5, 302-6, 302-7, and 302-8, which may be positioned adjacent to one another within the column 300. Specifically, each of these non-discharging ROM cells share at least one drain connection to an adjacent non-discharging ROM cell in the series 330. As shown in FIG. 3, non-discharging ROM cell 302-4 may be positioned at a first end of the non-discharging ROM cells and non-discharging ROM cell 302-8 may be positioned at a second end of the non-discharging ROM cells, and the remaining non-discharging ROM cells may be positioned in between ROM cells 302-4 and 302-8.

Each of the non-discharging ROM cells 302-4, 203-5, 302-6, 302-7, and 302-8 may be coupled to the bit line $BL_3$ using two drain connections. In particular, as shown in FIG. 3, vias 314, 315, 316, 317, 318, and 319 may be used to couple both drain connections of these non-discharging ROM cells to the bit line $BL_3$. Due to these couplings of the drain connections of the non-discharging ROM cells and the bit line $BL_3$, no significant discharge of the bit line $BL_3$ may occur during a read operation of any of these non-discharging ROM cells. Thus, in response to a read operation on either ROM cell 302-4, 203-5, 302-6, 302-7, or 302-8, the charged bit line $BL_3$ may output a value representative of logical "1".

As is known to those skilled in the art, with an increasing number of connections (i.e., vias) to the ROM cells 302 in FIG. 3, the bit line $BL_3$ and the reference voltage line 350 may each experience an increase in total capacitance. In particular, a connection (i.e., a via) between the ROM cells 302 and either the bit line $BL_3$ or the reference voltage line 350 may lead an increase in capacitance due to drain connections, vias, and/or the transistors of the cells 302. For example, as shown, the capacitive load on the bit line $BL_3$ may include capacitance from 13 drain connections, 7 vias, and 7 NMOS transistors. In addition, as shown, the capacitive load on the reference voltage line 350 may include capacitance from 9 drain connections, 5 vias, and 5 NMOS transistors. As known to those in the art, an increasing capacitive load on a bit line may lead to longer access time and cycle times when accessing a ROM array, which may degrade dynamic power and performance of the array.

In view of the above, various implementations described herein may be used to couple ROM cells of a ROM array to associated bit lines and reference voltage lines, while also reducing total capacitance on the associated bit lines by reducing the number of connections between the ROM cells and the associated bit lines. In particular, for adjacent non-discharging ROM cells, fewer connections (i.e., vias) may be used to couple the non-discharging ROM cells to a bit line, while also maintaining the stored data bit values of the non-discharging ROM cells.

Figure 4:
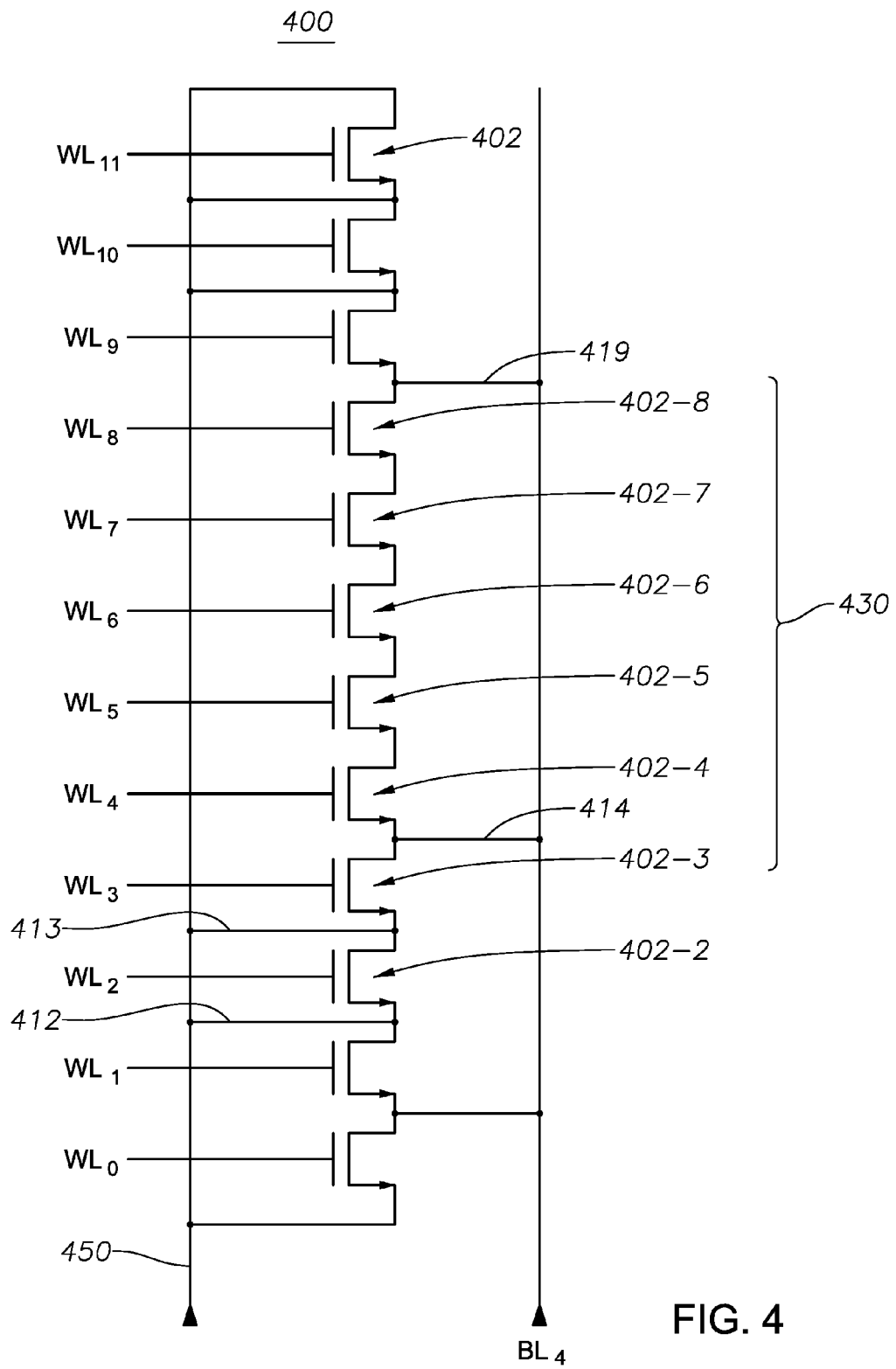
FIG. 4 illustrates a schematic diagram of a column of adjacent ROM cells in accordance with various implementations described herein.

For example, FIG. 4 illustrates a schematic diagram of a column 400 of adjacent ROM cells 402 in accordance with various implementations described herein. The column 400 may be included in a similar ROM array as those discussed above, such as ROM array 105. One or more other columns of ROM cells 402 may also be included in the same ROM array, though are not pictured in FIG. 4. The ROM cells 402 are adjacent within the column 400, in that each ROM cell in the column 400 shares at least one source or drain terminal connection (i.e., a drain connection) to an adjacent ROM cell, where such a drain connection may be used to couple to a bit line or reference voltage line, as further described below. As shown, the ROM cells 402 may include twelve ROM cells 402, though those in the art understand that greater than or fewer than twelve ROM cells 402 may be used.

The ROM array that includes the column 400 may also include a plurality of word lines (WL) $WL_0$ to $WL_{11}$, a column bit line $BL_4$, and a reference voltage line 450. Each row of ROM cells 402 may be connected to at least one of the plurality of word lines, where each word line may activate a particular row of the ROM cells 402. The column of ROM cells 402 may be disposed proximate to column bit line $BL_4$ and the reference voltage line 450.

As shown, each ROM cell 402 may comprise an NMOS transistor, though, as noted above, other transistors known in the art, such as a PMOS transistor, may be used. As also shown, adjacent ROM cells 402 in the column 400 may share a source terminal connection or a drain terminal connection (i.e., a drain connection) with one another. A shared drain connection may couple two ROM cells 402 to the reference voltage line 450 or to the bit line $BL_4$. For example, ROM cell 402-2 may share a drain connection with ROM cell 402-3, and this shared drain connection may be used to couple to the reference voltage line 450 using via 413.

When performing one or more read operations on the memory cells 402, the bit lines $BL_4$ may initially be pre-charged. In particular, the bit line $BL_4$ may be pre-charged to any voltage level known to those in the art, such as a power supply voltage level (i.e., $V_{DD}$). The reference voltage line 450 may also be set to a lower voltage level than the pre-charged bit line $BL_4$. For example, the reference voltage line 450 may be set to a ground voltage.

Similar to above, to encode a data bit that is representative of a logical "0" to cell 402, one of the drain connections of the cell 402 may be coupled to the bit line $BL_4$ and the remaining drain connection of the cell 402 may be coupled to the reference voltage line 450. For example, ROM cell 402-3 may have one drain connection coupled to the reference voltage line 450 using via 413, and the cell 402-3 may have the other drain connection coupled to the bit line $BL_4$ using via 414. Thus, during a read operation, when bit line $BL_4$ is pre-charged and word line $WL_4$ is enabled, the ROM cell 402-3 may discharge the bit line $BL_4$ onto the reference voltage line 450. As such, ROM cell 402-3 may be referred to as a discharging ROM cell. Thus, in response to the read operation on the ROM cell 402-3, the discharged bit line $BL_4$ may output a value representative of logical "0."

Further, and also similar to above, to encode a data bit that is representative of a logical "1" to a particular cell 402, both drain connections of the cell 402 may be coupled to the bit line $BL_4$, or both drain connections of the cell 402 may be coupled to the reference voltage line 450. For example, ROM cell 402-2 may have both drain connections coupled to the reference voltage line 450 using vias 412 and 413. Thus, during a read operation, when bit line $BL_4$ is pre-charged and word line $WL_2$ is enabled, no significant discharge of the bit line $BL_4$ may occur. As such, ROM cell 402-2 may be referred to as a non-discharging ROM cell. Thus, in response to the read operation on the ROM cell 402-2, the charged bit line $BL_4$ may output a value representative of logical "1". Again, it will be understood by those in the art that the encoding of "1" and "0" described above is merely a convention choice and could be trivially inverted.

As is also shown in FIG. 4, a subset of the column 400 of adjacent ROM cells 402 may include a series 430 of non-discharging ROM cells positioned adjacently to one another. In particular, this series 430 of non-discharging ROM cells may include ROM cells 402-4, 402-5, 402-6, 402-7, and 402-8, which may be positioned adjacent to one another within the column 400. Specifically, each of these non-discharging ROM cells share at least one drain connection to an adjacent non-discharging ROM cell in the series 430. As shown in FIG. 4, non-discharging ROM cell 402-4 may be positioned at a first end of the non-discharging ROM cells and non-discharging ROM cell 402-8 may be positioned at a second end of the non-discharging ROM cells, and the remaining non-discharging ROM cells may be positioned in between ROM cells 402-4 and 402-8.

As shown, the series 430 of non-discharging ROM cells may be similar to the series 330 of non-discharging ROM cells. However, the series 430 of non-discharging ROM cells differ from the series 330, in that the series 430 of non-discharging ROM cells may be coupled to its associated bit line $BL_4$ using no more than two connections (i.e., vias). In particular, as shown in FIG. 4, a drain connection of the ROM cell 402-4 may be coupled to the bit line $BL_4$ using via 414, and a drain connection of the ROM cell 402-8 may be coupled to the bit line $BL_4$ using via 419, and no other vias may be used to couple the non-discharging ROM cells 402-4, 402-5, 402-6, 402-7, and 402-8 to the $BL_4$.

However, even without the added vias, the logical values produced by the non-discharging ROM cells 402-4, 402-5, 402-6, 402-7, and 402-8 during a read operation may be identical to their counterparts in FIG. 3. In particular, because no drain connection of each of these non-discharging ROM cells is coupled to the reference voltage line 450, none of the non-discharging ROM cells 402-4, 402-5, 402-6, 402-7, and 402-8 may discharge the $BL_4$ when activated during a read operation. Thus, as shown in FIG. 4, in response to a read operation on either ROM cell 402-4, 402-5, 402-6, 402-7, and 402-8, the charged bit line $BL_4$ may not be significantly discharged and may output a value representative of logical "1".

For example, ROM cell 402-7 may have neither drain connection coupled to the reference voltage line 450 or the bit line $BL_4$. Thus, during a read operation, when bit line $BL_4$ is pre-charged and word line $WL_R$ is enabled, no significant discharge of the bit line $BL_4$ may occur. Thus, in response to the read operation on the ROM cell 402-7, the charged bit line $BL_4$ may output a value representative of logical "1".

In a similar example, ROM cell 402-8 may have one drain connection coupled to the bit line $BL_4$, and the other drain connection uncoupled to the reference voltage line 450 or the bit line $BL_4$. Thus, during a read operation, when bit line $BL_4$ is pre-charged and word line $WL_8$ is enabled, no significant discharge of the bit line $BL_4$ may occur. Thus, in response to the read operation on the ROM cell 402-8, the charged bit line $BL_4$ may output a value representative of logical "1".

Thus, the logical values produced by the non-discharging ROM cells 402-4, 402-5, 402-6, 402-7, and 402-8 during a read operation may be identical to their counterparts in FIG. 3, while utilizing fewer vias.

For example, as shown in FIG. 4, the capacitive load on the bit line $BL_4$ may include capacitance from 6 drain connections, 3 vias, and 3 NMOS transistors. In addition, as shown the capacitive load on the reference voltage line 450 may include capacitance from 9 drain connections, 5 vias, and 5 NMOS transistors. Thus, when compared to FIG. 3, the capacitive load on the bit line $BL_4$ may include capacitances from 7 fewer drain connections, 4 fewer vias, and 4 fewer NMOS transistors.

As noted above, decreasing a capacitive load on a bit line may lead to shorter access time and cycle times when accessing a ROM array, which may improve dynamic power and performance of the array. In particular, the reduced capacitive load may reduce switching power, thereby improving performance. Further, dynamic power may be improved due to the decrease in capacitance, as dynamic power is directly proportional to bit line capacitance. With reduced bit line capacitance, a bit line discharge time may be reduced, and a cycle time closure for a maximum capacitive load on a bit line may be reduced by 50%. Further, the improvement in performance may be accomplished by reducing connections between ROM cells and a bit line, which may be carried out without area penalty. Further, with the reduced connections, there may be no reverse bias current through the transistors of the ROM cells, which may reduce overall static power and leakage.

Thus, for adjacent, non-discharging ROM cells in a column of ROM cells, a first via may be used to couple an associated bit line to a drain connection of a first non-discharging ROM cell positioned at a first end of the adjacent, non-discharging ROM cells, and a second via may be used to couple the associated bit line to a drain connection of a second non-discharging ROM cell positioned at a second end of the adjacent, non-discharging ROM cells. Other vias coupling the bit line to the non-discharging ROM cells disposed between the first non-discharging ROM cell and the second non-discharging ROM cell may not be needed for these non-discharging ROM cells to remain non-discharging.

In another implementation, the number of adjacent, non-discharging ROM cells in a column of ROM cells may be equal to 2. In such an implementation, the shared drain connection of the adjacent, non-discharging ROM cells may not be coupled to an associated bit line, while the remaining drain connections of both non-discharging ROM cells may be coupled to the bit line. In such an implementation, both adjacent, non-discharging ROM cells may remain non-discharging.

Figure 5:
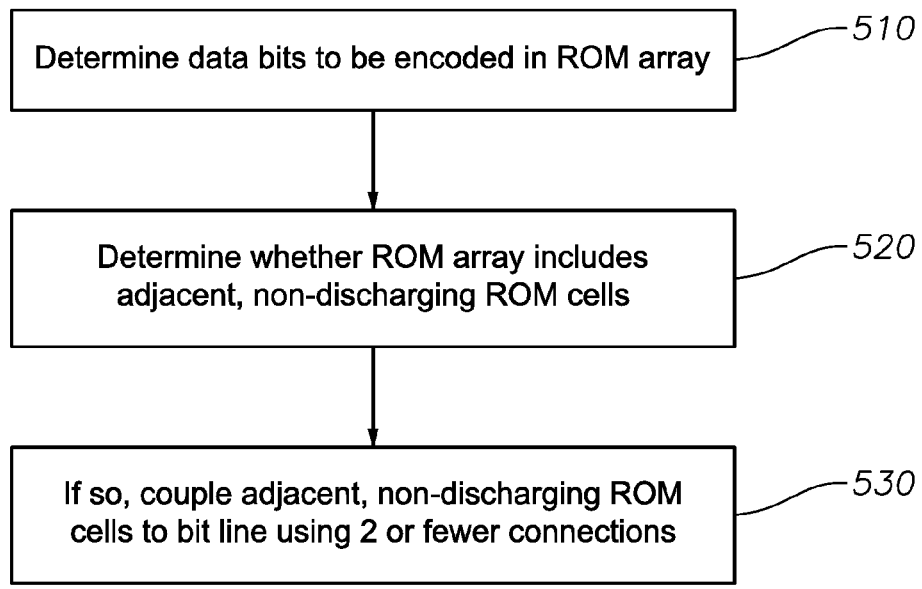
FIG. 5 illustrates a process flow diagram for a method of encoding a plurality of ROM cells in a ROM array to an associated bit line in accordance with various implementations described herein.

FIG. 5 illustrates a process flow diagram for a method 500 of encoding a plurality of ROM cells in a ROM array to an associated bit line in accordance with various implementations described herein. It should be understood that while method 500 indicates a particular order of execution of operations, in some implementations, certain portions of the operations might be executed in a different order, and on different systems. Further, in some implementations, additional operations or blocks may be added to the method. Likewise, some operations or blocks may be omitted.

At block 510, one or more data bit values to be encoded in the ROM array may be determined. As noted above, the ROM cells of the array are configured to store data bit values permanently, even in the absence of power (e.g., after a power down).

At block 520, whether the ROM array includes a plurality of adjacent, non-discharging ROM cells disposed in a column of the ROM array may be determined. For example, as shown in FIG. 4 above, the column 400 may include non-discharging ROM cells 402-4, 402-5, 402-6, 402-7, and 402-8, which may be positioned adjacent to one another within the column 400. Specifically, each of these non-discharging ROM cells may share at least one drain connection with one another.

At block 530, if there are adjacent, non-discharging ROM cells disposed in a column in the ROM array, then the plurality of adjacent, non-discharging ROM cells may be coupled to a bit line associated with the column using two or fewer connections. In particular, a first via may be used to couple an associated bit line to a drain connection of a first non-discharging ROM cell positioned at a first end of the adjacent, non-discharging ROM cells, and a second via may be used to couple the associated bit line to a drain connection of a second non-discharging ROM cell positioned at a second end of the adjacent, non-discharging ROM cells. Other vias coupling the bit line to the non-discharging ROM cells disposed between the first non-discharging ROM cell and the second non-discharging ROM cell may not be needed for these non-discharging ROM cells to remain non-discharging. For example, as shown in FIG. 4, a drain connection of the ROM cell 402-4 may be coupled to the bit line $BL_4$ using via 414, and a drain connection of the ROM cell 402-8 may be coupled to the bit line $BL_4$ using via 419, and no other vias may be used to couple the non-discharging ROM cells 402-4, 402-5, 402-6, 402-7, and 402-8 to the $BL_4$.

In another implementation, the data bit values to be stored in ROM cells of a ROM array may be received by a computing system, and the computing system may generate (i.e., compile) a layout of the ROM array that includes one or more vias in the array for encoding the data bit values into the cells. In particular, the computing system may perform method 500 to determine how many vias are to be placed in the ROM array, particularly for adjacent, non-discharging ROM cells disposed in a column.

Figure 6:
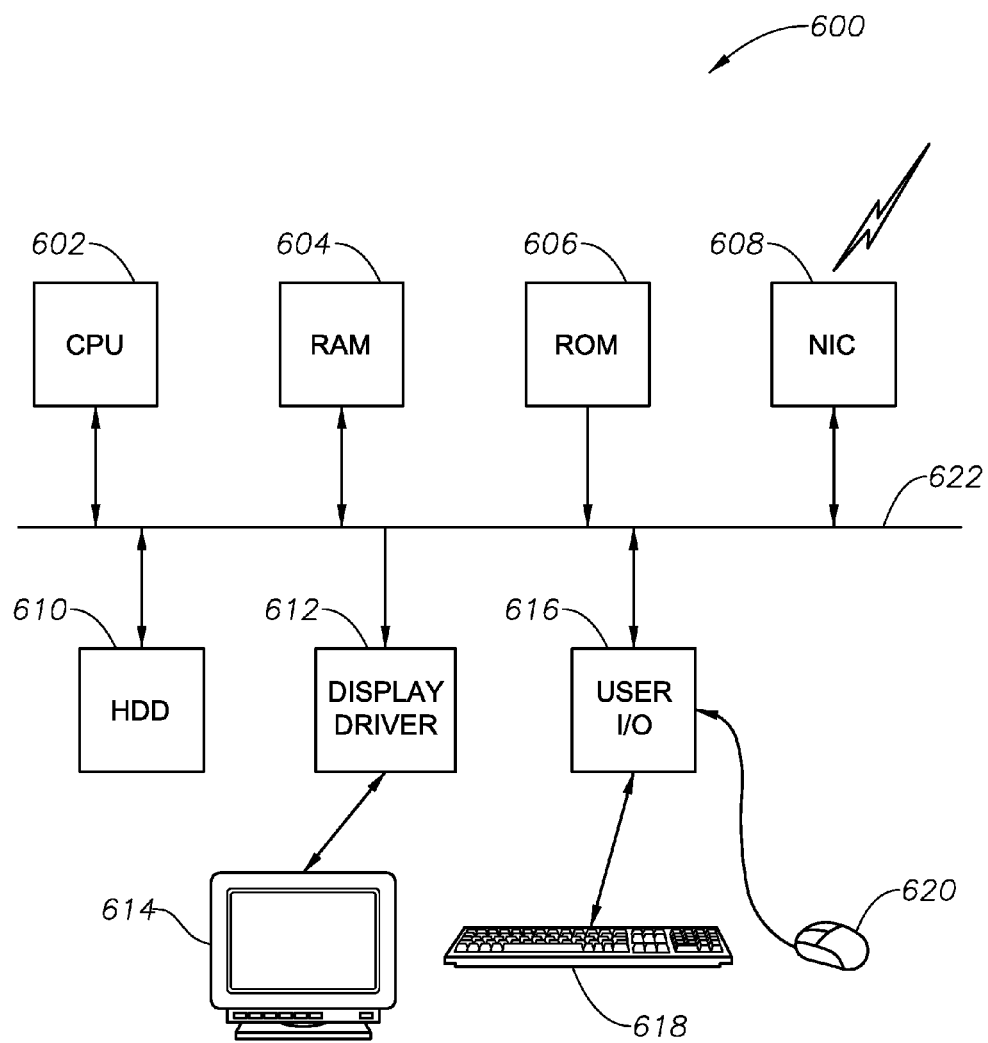
FIG. 6 illustrates a general purpose computer of the type that may be used to implement the above described memory compilation operation in order to generate a memory instance.

FIG. 6 illustrates a general purpose computer 600 (i.e., a computing system) of the type that may be used to implement the above described memory compilation operation in order to generate a memory instance. The general purpose computer 600 may include a central processing unit 602, a random access memory 604, a ROM 606, a network interface card 608, a hard disk drive 610, a display driver 612 and monitor 614 and a user input/output circuit 616 with a keyboard 618 and mouse 620 all connected via a common bus 622. In operation the central processing unit 602 may execute computer program instructions that may be stored in one or more of the random access memory 604, the ROM 606 and the hard disk drive 610 or dynamically downloaded via the network interface card 608. The results of the processing performed may be displayed to a user via the display driver 612 and the monitor 614. User inputs for controlling the operation of the general purpose computer 600 may be received via the user input output circuit 616 from the keyboard 618 or the mouse 620 (and hence for example the input parameters used to determine certain properties of the required memory instance can be entered via this mechanism). It will be appreciated that the computer program could be written in a variety of different computer languages. The computer program may be stored and distributed on a recording medium or dynamically downloaded to the general purpose computer 600. When operating under control of an appropriate computer program, the general purpose computer 600 can perform the above described memory compiler operation and can be considered to form an apparatus for performing the above described memory compiler operation. The architecture of the general purpose computer 600 could vary considerably and FIG. 6 is only one example.

The description provided herein may be directed to specific implementations. It should be understood that the discussion provided herein is provided for the purpose of enabling a person with ordinary skill in the art to make and use any subject matter defined herein by the subject matter of the claims.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve a developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a read-only memory (ROM) array comprising a plurality of ROM cells arranged into a column, wherein the column is disposed proximate to a bit line and to a reference voltage line;
   wherein the plurality of ROM cells arranged into the column include a plurality of non-discharging ROM cells positioned adjacently to one another, wherein each non-discharging ROM cell has a source terminal, a drain terminal, or both coupled to at least one adjacent non-discharging ROM cell; and
   wherein the plurality of non-discharging ROM cells comprises:
      a first non-discharging ROM cell positioned at a first end of the plurality of non-discharging ROM cells; and
      a second non-discharging ROM cell positioned at a second end of the plurality of non-discharging ROM cells;
   wherein the plurality of non-discharging ROM cells are coupled to the bit line using two or fewer connections comprising a first via and a second via, wherein the first via couples a source terminal or a drain terminal of the first non-discharging ROM cell to the bit line, and the second via couples a source terminal or a drain terminal of the second non-discharging ROM cell to the bit line; and
   wherein no vias are used to couple the bit line to source terminals or drain terminals of one or more non-discharging ROM cells disposed between the first non-discharging ROM cell and the second non-discharging ROM cell.

2. The integrated circuit of claim 1, wherein:
   during a read operation performed on the plurality of non-discharging ROM cells, the plurality of non-discharging ROM cells are configured to not substantially discharge the bit line onto the reference voltage line; and
   during the read operation, the bit line is configured to output a value representative of logical "1" for one of the plurality of non-discharging ROM cells.

3. The integrated circuit of claim 1, wherein, during a read operation performed on the plurality of non-discharging ROM cells, the plurality of non-discharging ROM cells are configured to not substantially discharge the bit line onto the reference voltage line.

4. The integrated circuit of claim 1, wherein, during a read operation on the plurality of ROM cells, the bit line is pre-charged to a power supply voltage level and the reference voltage line is set to a ground voltage level.

5. The integrated circuit of claim 1, wherein the plurality of non-discharging ROM cells is configured to store data bits having a logical value of 1.

6. The integrated circuit of claim 1, wherein each of the plurality of ROM cells shares a source terminal or a drain terminal with an adjacent ROM cell of the plurality of ROM cells.

7. The integrated circuit of claim 1, wherein:
the plurality of ROM cells include a discharging ROM cell, the discharging ROM cell comprising a first drain connection coupled to the bit line and a second drain connection of the discharging ROM cell coupled to the reference voltage line; and
during a read operation performed on the discharging ROM cell, the discharging ROM cell is configured to discharge the bit line onto the reference voltage line.

8. The integrated circuit of claim 1, wherein each of the plurality of ROM cells comprises an NMOS transistor.

9. The integrated circuit of claim 1, wherein the column of ROM cells is one of a plurality of columns of ROM cells in the ROM array.

10. A read-only memory (ROM) device, comprising:
a ROM array comprising a plurality of ROM cells arranged into a column, wherein the column is disposed proximate to a bit line and to a reference voltage line;
wherein the plurality of ROM cells arranged into the column includes a plurality of non-discharging ROM cells positioned adjacently to one another, wherein each non-discharging ROM cell has a source terminal, a drain terminal, or both coupled to at least one adjacent non-discharging ROM cell; and
wherein the plurality of non-discharging ROM cells comprises:
a first non-discharging ROM cell positioned at a first end of the plurality of non-discharging ROM cells; and
a second non-discharging ROM cell positioned at a second end of the plurality of non-discharging ROM cells;
wherein the plurality of non-discharging ROM cells are coupled to the bit line using two or fewer connections comprising a first via and a second via, wherein the first via couples a source terminal or a drain terminal of the first non-discharging ROM cell to the bit line, and the second via couples a source terminal or a drain terminal of the second non-discharging ROM cell to the bit line; and
wherein no vias are used to couple the bit line to source terminals or drain terminals of one or more non-discharging ROM cells disposed between the first non-discharging ROM cell and the second non-discharging ROM cell.

11. The ROM device of claim 10, wherein:
during a read operation performed on the plurality of non-discharging ROM cells, the plurality of non-discharging ROM cells are configured to not substantially discharge the bit line onto the reference voltage line; and
during the read operation, the bit line is configured to output a value representative of logical "1" for one of the plurality of non-discharging ROM cells.

* * * * *